United States Patent [19]

Masuda

[11] 4,015,216
[45] Mar. 29, 1977

[54] FREQUENCY-VOLTAGE CONVERTER AND A STABILIZED PULSE GENERATOR USING IT

[75] Inventor: Kenzo Masuda, Tokorozawa, Japan
[73] Assignee: Hitachi, Ltd., Japan
[22] Filed: July 24, 1975
[21] Appl. No.: 598,803

[30] Foreign Application Priority Data

July 31, 1974 Japan .............................. 48-87007
July 31, 1974 Japan .............................. 48-87015

[52] U.S. Cl. .............................. 331/8; 307/233 R; 307/295; 307/303; 307/304; 331/34; 331/108 D; 331/111; 331/176; 357/23; 357/41
[51] Int. Cl.² .................... H01L 29/78; H03K 1/16
[58] Field of Search ............... 307/233 R, 295, 304, 307/303; 331/1 R, 8, 9, 34, 108 C, 108 D, 111, 176, 113 R, 177 R; 328/140; 357/23, 41

[56] References Cited

UNITED STATES PATENTS

| | | | |
|---|---|---|---|
| 2,531,301 | 11/1950 | Scholten | 331/1 R |
| 3,657,560 | 4/1972 | Proebsting | 307/233 |
| 3,758,865 | 9/1973 | McKibben | 331/1 R X |
| 3,851,277 | 11/1974 | Suzuki et al. | 331/108 D X |

OTHER PUBLICATIONS

Hamaoui, "Analog Multiplier/Divider Simplifies Frequency Locking", Electronics, July 5, 1973, pp. 99–100.
Ruston, "A Simple Crystal Discriminator for FM Oscillator Stabilization", Proceedings of the I.R.E., July 1951, pp. 783–788.
Sabaroff, "Negative Feedback Applied to Oscillators", Electronics, May 1940, pp. 32–33.

Primary Examiner—Siegfried H. Grimm
Attorney, Agent, or Firm—Craig & Antonelli

[57] ABSTRACT

A frequency-voltage converter using a charge-pump element and a pulse generating circuit stabilized in frequency of the output pulse signal by using the frequency-voltage converter for detecting the deviation or variation of the frequency of the output pulse signal.

7 Claims, 6 Drawing Figures

FREQUENCY-VOLTAGE CONVERTER AND A STABILIZED PULSE GENERATOR USING IT

The present invention relates to an electrical converter such as frequency-to-voltage or frequency-to-current converter and the application thereof.

As a frequency discriminating circuit constructed in a semiconductor integrated circuit device, there has been well known a phase locked loop (PLL) circit as described in 1969 IEEE, International Solid-State Circuit Conference, Pages 100 and 101, THAM 8.5, "Phase Locking as a New Approach for Tuned Integrated Circuits". Furthermore, in an integrated circuit device having a pulse signal generator therein, specific compensation means have been needed in order to stabilize the oscillating frequency. However, the foregoing PLL circuit has the disadvantage of being expensive since the circuit structure is very complex and contains many circuit elements.

An object of the present invention is to provide a converter having a simple circuit structure which converts the frequency of signals to be measured or treated into voltage or current signals.

Another object of the present invention is to provide an improved pulse generating circuit which is stabilized in frequency variation.

The present invention is described in detail in connection with attached drawings.

Figure 1:
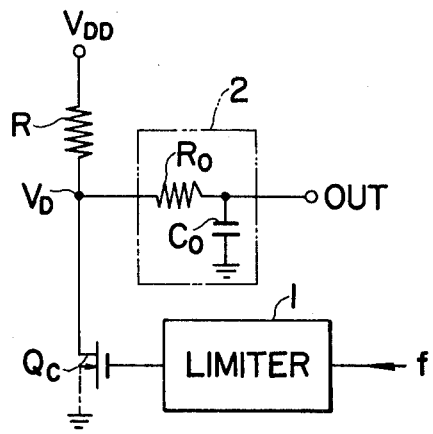
FIG. 1 shows a circuit diagram of an electrical converter according to the present invention.
Figure 2A:
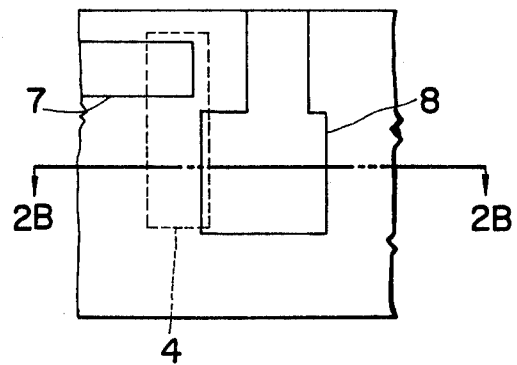
FIG. 2a and FIG. 2b show respectively a plane view and a cross sectional view of the circuit element which is used in the circuit as shown in FIG. 1.
Figure 2B:
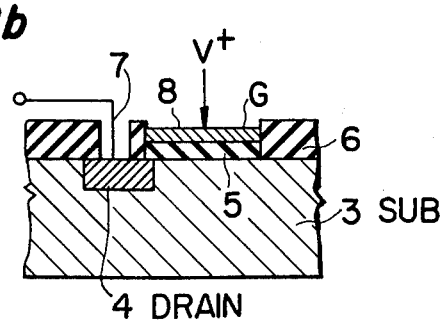

FIG. 1 shows a frequency-voltage converter according to the present invention in which an input signal with a frequency f is supplied to the gate electrode of a specific circuit element Qc through a limiter circuit 1, the drain (or source) of Qc is connected to a voltage source terminal VDD through a resistor R, an output signal is derived from the connection point of resistor R and the drain (or source) of Qc through a filter circuit 2 for eliminating ripple component included therein, the ripple filter comprising a resistor Ro and a capacitor Co as shown. The foregoing specific circuit element Qc is a so called charge-pump element and comprises a semiconductor substrate (for example of N conductivity type) 3, a semiconductor region of opposite conductivity type (for example P type) 4 which acts as a drain or source region thereof, a thin insulating film 5 (for example of silicon oxide) covering the major surface portion of the substrate including partially a surface portion of the semiconductor region 4, a drain or source electrode 7 connected to the semiconductor region 4, and a gate electrode formed on the thin insulating film 5 so as to cover the substrate surface thereunder. It should be understood that the foregoing charge pump element has substantially the same structure as well known MOS FET, but it does not need to have both the regions of source and drain.

The charge-pump element Qc operates as follows. When a predetermined voltage not less than the threshold voltage is supplied to the gate electrode, an inversion layer is induced at the substrate surface under the gate electrode and carriers are injected therein from the drain. When the supplied gate voltage is removed, the injected carriers almost come back to the drain but a very small amount of the injected carriers are recombined with a result that a small amount of electric current flows between the drain and the substrate. Since the mean value of this current flowing between the drain and the substrate changes in correspondence to the frequency of the source supplying the gate voltage, the magnitude of the electric current per unit time is proportional to the frequency f of the input signal supplied to the gate electrode.

Therefore, as shown in FIG. 1, by supplying a voltage source $V_{DD}$ to the drain of charge-pump element Qc through a resistor R, the voltage potential $V_D$ at the drain of Qc is reduced by the voltage drop due to the electric current I flowing in the substrate and the resistor R. Namely, the current flow becomes large and the drain voltage potential $V_D$ of Qc becomes low as the frequency f becomes high, and inversely the current flow in the substrate due to element Qc becomes small and the drain voltage of Qc becomes increased. Thus the conversion of frequency f to voltage V can be obtained.

It is desirable to make the thus obtained output voltage $V_D$ smooth by using a ripple filter 2 as shown in the drawing since the foregoing electric current I flows intermittently and thereby a ripple-waveform appears on the output voltage $V_D$.

It is further desirable to provide a limiter circuit 1 for keeping the input voltage to be applied to the gate electrode within a predetermined level since otherwise the output voltage $V_D$ would be changed by the injected carriers caused by the magnitude of the input signal.

As clearly understood from the foregoing statements, according to the present invention, an improved converter can be obtained which may be constructed having a simple circuit structure using a charge-pump element and a resistor and is quite applicable to a semiconductor integrated circuit device, thereby enabling the construction of a low cost miniaturized circuit system.

The present invention is not limited to the foregoing embodiment and may be modified by using alternative modified means. For example, the charge-pump element may be either of P channel type or N channel type. Furthermore the converter may be constructed so as to directly use the electric current flowing through the charge-pump element.

The converter circuit according to the present invention is widely used as converting means for converting the frequency component of alternative electric signals to another electric parameter.

Figure 3:
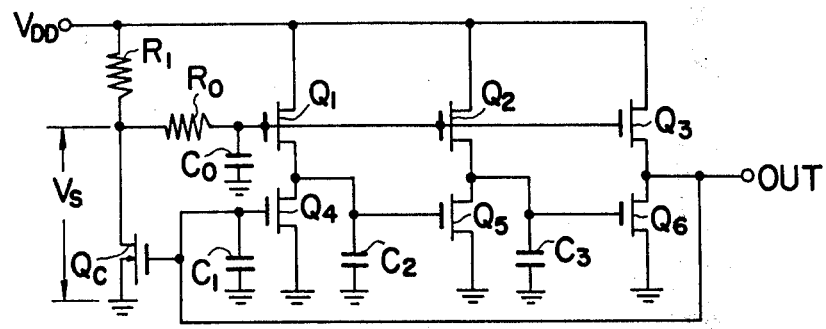
FIGS. 3 and 4 show circuit diagrams of pulse generators using such converter according to the present invention.
Figure 4:
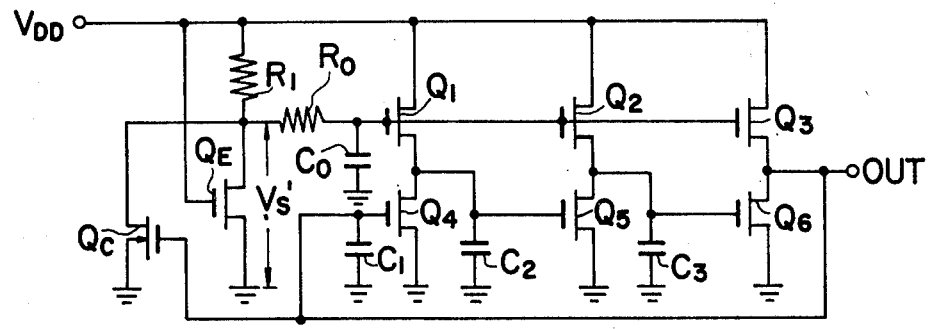
Figure 5:
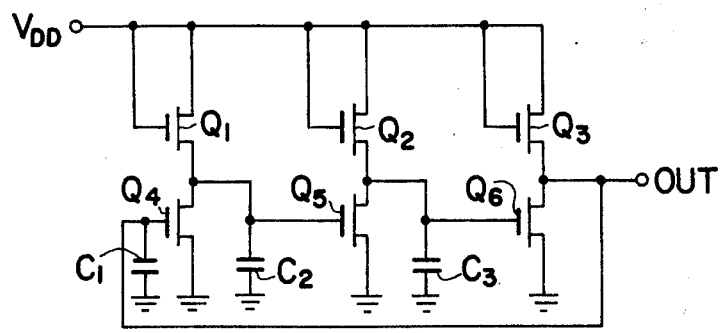
FIG. 5 shows a circuit diagram of pulse generator without using a converter of the present invention.

Next, stabilized pulse generator circuits using the foregoing converter circuit are explained in accordance with FIGS. 3 and 4, comparing an unstabilized pulse generator as shown in FIG. 5.

FIG. 5 shows a pulse generator without using a converter of the present invention, wherein three stages of inverter circuits comprising MOS FETs (Q1, Q4), (Q2, Q5) an (Q3, Q6) are connected in cascade. The present inventor found that the pulse generator shown in FIG. 5 has the following disadvantages: (1) The oscillating frequency is made quite unstable by a deviation or variation in condensers C1 to C3, in the resistances of the load MOS FETs Q1 to Q3 and in the threshold voltages driving MOS FETs Q4 to Q6. (2) Especially, the deviation or variation in the frequency of generated signals is caused to be enlarged due to the relatively large dependency to ambient temperature of MOS FETs and due to the deviation in manufacturing processes thereof.

Therefore, the present inventor proposes to use the foregoing converter as a compensating means for stabilizing the frequency of the oscillating pulses in such a pulse generating circuit as shown in FIGS. 3 and 4.

In FIG. 3, three stages of inverter circuits (Q1, Q4), (Q2, Q5) and (Q3, Q6) are connected in cascade, the output terminal of the last inverter (Q3, Q6) is coupled to the input terminal of the first inverter (Q1, Q4), the connection point therebetween is coupled to the gate electrode of a charge-pump element Qc, which is a MOS FET without source (or drain), and the drain (or source) of the element Qc is coupled to a voltage source $V_{DD}$ through a resistor R1. The voltage signal Vs appearing at the connection point between the resistor R1 and Qc is supplied to the gate electrodes of load MOS FETs Q1 to Q3 through a ripple filter circuit comprising a resistor Ro and a capacitor Co.

In this circuit, the voltage signal Vs detected by the f-V converter corresponding to the deviation or variation in the output pulse signals is supplied to the load MOS FETs, thereby the conductance or impedance of the load MOS FETs are controlled so that the frequency of the output pulse signal is automatically stabilized. Namely, when the frequency of the output pulse signal becomes high, the electric current in Qc becomes large and the voltage Vs to be supplied to the gate electrodes of load MOS FETs Q1 to Q3 decreases. Thereby the impedances of the load MOS FETs Q1 to Q3 become large and the time constants for determining the frequency of the generated pulse become large resulting in a decrease of the frequency thereof. Inversely, when the frequency of the output pulse signal becomes low, the time constant becomes small resulting in an increase of the frequency thereof.

In this embodiment it should be noted that all of the MOS FETs Q1 to Q6 as well as the charge-pump element Qc can be manufactured in a semiconductor monocrystalline body through substantially the same process.

FIG. 4 shows a modified pulse generator according to the present invention, wherein an additional MOSFET QE is connected in parallel to the charge-pump element, with the gate electrode of QE connected to the supply voltage terminal in order to further improve the stability of the generated pulse frequency with respect to the increase of the supply voltage level due to the ambient temperature.

The operation of the additional MOS FET QE is described in detail in a co-pending U.S. application Ser. No. 453168 filed Mar. 20, 1974, now U.S. Pat. No. 3,975,649, (British Application, Serial No. 2105/74), filed on behalf of the same assignee as in the present application. Namely, if the supply voltage $V_{DD}$ is increased by the variation in the ambient temperature, the gate potential of QE becomes larger and QE's impedance is lowered. The electric current flowing through the resistor R1 then becomes larger and thereby the voltage potential Vs' to be supplied to the gate electrodes of MOS FETs Q1 to Q3 is lowered compensating for the variation in the pulse frequency generated by the circuit caused by the ambient temperature or supply voltage level.

In both embodiments, the resistor R1 may be provided by way of an externally connected resistor or a resistor integrated in or on the same semiconductor body as the other circuit elements. Also, the resistor R1 may be formed by a MOS FET load. However, it is desirable for the resistor R1 to be an externally connected resistor in event that a relatively small temperature dependency is needed for the resistor R1 or that the generated pulse frequency needs to be set to a specifically predetermined frequency since the frequency of the output pulses may be adjusted by controlling the value of the resistor R1.

The present invention is not limited to only a pulse generator having three inverter stages, but can also apply to having an odd number of inverter stages. Furthermore, the present invention is also applicable to an oscillator wherein the frequency of the output signal is determined by a variable impedance means as well as by inverter means.

What I claim is:

1. A converter comprising means for connecting a chargepump element to a supply voltage source through a detecting means for detecting an electrical parameter derived from the charge-pump element, means for supplying an alternating input signal to the gate electrode of said charge-pump element, and output means coupled to the connection point between said charge-pump element and said detecting means.

2. In an oscillator having variable impedance means to substantially determine the frequency of the output signal thereof by the variable impedance, wherein an improvement comprises means including a charge-pump element for converting the frequency of the output signal into a voltage signal, means for supplying the output signal of the oscillator to a gate electrode of said charge-pump element as the input of said converting means, means for controlling the impedance of said variable impedance means by the output signal of said converting means so as to stabilize the frequency of said output signal of said oscillator.

3. In a pulse generator having a cascadely connected plurality of inverter stages each comprising a driving FET and a load FET, wherein an improvement comprises a chargepump element, a resistor means, means for connecting said charge-pump element to a voltage supply source through said resistor means, means for coupling the output terminal of one of said inverter stages to the gate of said charge-pump element, and means for coupling the connection point of said charge-pump element and said resistor means to at least one of the gate electrodes of said load FETs.

4. A pulse generator according to claim 3, wherein said means for coupling the connection point of said charge-pump element and said resistor means to at least one of the gate electrodes of said load FETs comprises ripple filter means.

5. In a pulse generator having a cascadely connected plurality of inverter stages each comprising a driving FET and a load FET, wherein an improvement comprises converter means having an input terminal and an output terminal for converting the frequency of an output signal of the pulse generator applied to the input terminal into a voltage signal at the output terminal thereof, and coupling means for coupling the output terminal of said converter means to at least one of the gate electrode of said load FETs.

6. A pulse generator according to claim 5, wherein said coupling means comprises a ripple filter connected between the output terminal of said converter means and at least one of the gate electrodes of said load FETs.

7. A pulse generator according to claim 5, wherein said coupling means is commonly connected to the gate electrodes of said load FETs.

* * * * *